United States Patent
Forghani-Zadeh et al.

(10) Patent No.: US 9,159,725 B2
(45) Date of Patent: Oct. 13, 2015

(54) CONTROLLED ON AND OFF TIME SCHEME FOR MONOLITHIC CASCODED POWER TRANSISTORS

(71) Applicant: Texas Instruments Incorporated, Dallas, TX (US)

(72) Inventors: Hassan P. Forghani-Zadeh, Allen, TX (US); Sameer Pendharkar, Allen, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 93 days.

(21) Appl. No.: 13/946,415

(22) Filed: Jul. 19, 2013

(65) Prior Publication Data

US 2015/0021614 A1   Jan. 22, 2015

(51) Int. Cl.
*H01L 31/0256* (2006.01)
*H01L 27/088* (2006.01)
*H01L 29/20* (2006.01)
*H01L 21/8236* (2006.01)
*H01L 29/778* (2006.01)

(52) U.S. Cl.
CPC ........ *H01L 27/0883* (2013.01); *H01L 21/8236* (2013.01); *H01L 29/2003* (2013.01); *H01L 29/7787* (2013.01)

(58) Field of Classification Search
CPC ............ H01L 27/0883; H01L 21/8236; H01L 29/7787
USPC ................ 257/76; 438/275; 323/311; 326/97
See application file for complete search history.

(56) References Cited

U.S. PATENT DOCUMENTS

| | | | | |
|---|---|---|---|---|
| 5,909,128 A | * | 6/1999 | Maeda | 326/116 |
| 2011/0199148 A1 | * | 8/2011 | Iwamura | 327/430 |
| 2012/0319758 A1 | * | 12/2012 | Kobayashi et al. | 327/432 |
| 2014/0312429 A1 | * | 10/2014 | Bramian et al. | 257/392 |

* cited by examiner

*Primary Examiner* — Howard Weiss
(74) *Attorney, Agent, or Firm* — William B. Kempler; Frank D. Cimino

(57) ABSTRACT

A semiconductor device includes a depletion mode GaN FET cascoded with an enhancement mode NMOS transistor. A gate of the GaN FET is electrically coupled to a source of the NMOS transistor through a gate network. The gate network controls at least one of a turn-on time and a turn-off time of the GaN FET. The gate network may be controlled by an input signal to a gate of the NMOS transistor.

18 Claims, 4 Drawing Sheets

US 9,159,725 B2

CONTROLLED ON AND OFF TIME SCHEME FOR MONOLITHIC CASCODED POWER TRANSISTORS

FIELD OF THE INVENTION

This invention relates to the field of semiconductor devices. More particularly, this invention relates to gallium nitride field effect transistors.

BACKGROUND OF THE INVENTION

Depletion mode gallium nitride field effect transistors (GaN FETs) are frequently cascoded with enhancement mode silicon n-channel metal oxide semiconductor (NMOS) transistors to provide a high impedance in an unpowered state. Rapid switching of the cascoded NMOS transistors may cause undesirable transients in power switching applications.

SUMMARY OF THE INVENTION

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A semiconductor device includes a depletion mode GaN FET cascoded with an enhancement mode NMOS transistor. A gate of the GaN FET is electrically coupled to a source of the NMOS transistor through a gate network. The gate network controls at least one of a turn-on time and a turn-off time of the GaN FET. The gate network may be controlled by an input signal to a gate of the NMOS transistor.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

A semiconductor device includes a depletion mode GaN FET cascoded with an enhancement mode NMOS transistor. A gate of the GaN FET is electrically coupled to a source of the NMOS transistor through a gate network. The gate network controls at least one of a turn-on time and a turn-off time of the GaN FET. The gate network may be controlled by an input signal to a gate of the NMOS transistor.

Figure 1:
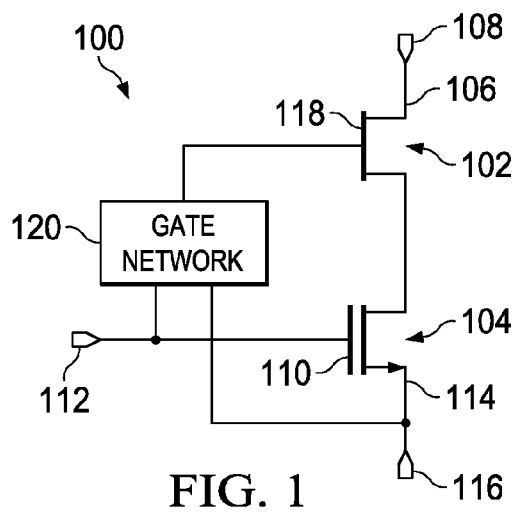
FIG. 1 is a schematic of an exemplary three-terminal semiconductor device.

FIG. 1 is a schematic of an exemplary three-terminal semiconductor device. The semiconductor device 100 includes a depletion mode GaN FET 102 cascoded with an NMOS transistor 104. A drain 106 of the GaN FET 102 is coupled to a drain terminal 108 of the semiconductor device 100. A gate 110 of the NMOS transistor 104 is coupled to a gate terminal 112 of the semiconductor device 100. A source 114 of the NMOS transistor 104 is coupled to a source terminal 116 of the semiconductor device 100.

A gate 118 of the GaN FET 102 is coupled to the source 114 of the NMOS transistor 104 through a gate network 120. The gate network 120 is configured to control at least one of a turn-on time and a turn-off time of the GaN FET 102. For example, the turn-on time and/or the turn-off time, as controlled by the gate network 120, may be 1 to 10 nanoseconds. The gate network 120 may be optionally coupled to the gate terminal 112 so that action of the gate network 120 is influenced by gate signals applied to the gate terminal 112.

Figure 2:
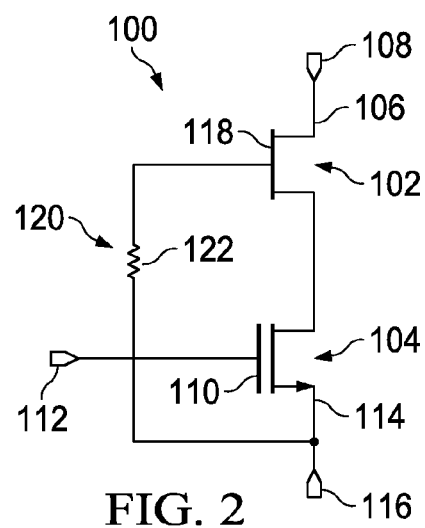
FIG. 2 is a schematic of a specific semiconductor device per the example of FIG. 1.

FIG. 2 is a schematic of a specific semiconductor device per the example of FIG. 1. The gate network 120 includes a resistor 122 which limits current between the gate 118 of the GaN FET 102 and the source 114 of the NMOS transistor 104. The gate 118 of the GaN FET 102 has some capacitance to the drain 106 of the GaN FET 102. The gate 118 of the GaN FET 102 and the resistor 122 form a resistor-capacitor network with a time constant that thereby controls both the turn-on time and the turn-off time of the GaN FET 102. A value of the resistor 122 may be adjusted to control the turn-on time and the turn-off time to 1 to 10 nanoseconds.

Figure 3:
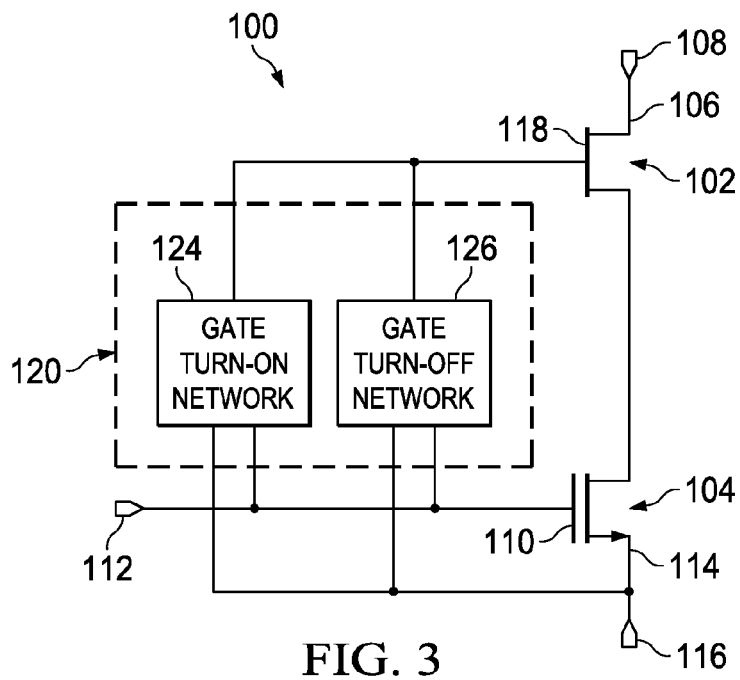
FIG. 3 is a schematic of another semiconductor device per the example of FIG. 1.

FIG. 3 is a schematic of another semiconductor device per the example of FIG. 1. The gate network 120 includes a gate turn-on network 124 and a gate turn-off network 126. The gate turn-on network 124 controls the turn-on time of the GaN FET 102, for example, 1 to 10 nanoseconds. The gate turn-off network 126 controls the turn-off time of the GaN FET 102, for example, 1 to 10 nanoseconds. The gate turn-on network 124 and/or the gate turn-off network 126 may be optionally coupled to the gate terminal 112 so that action of the gate network 120 is influenced by gate signals applied to the gate terminal 112.

Figure 4:
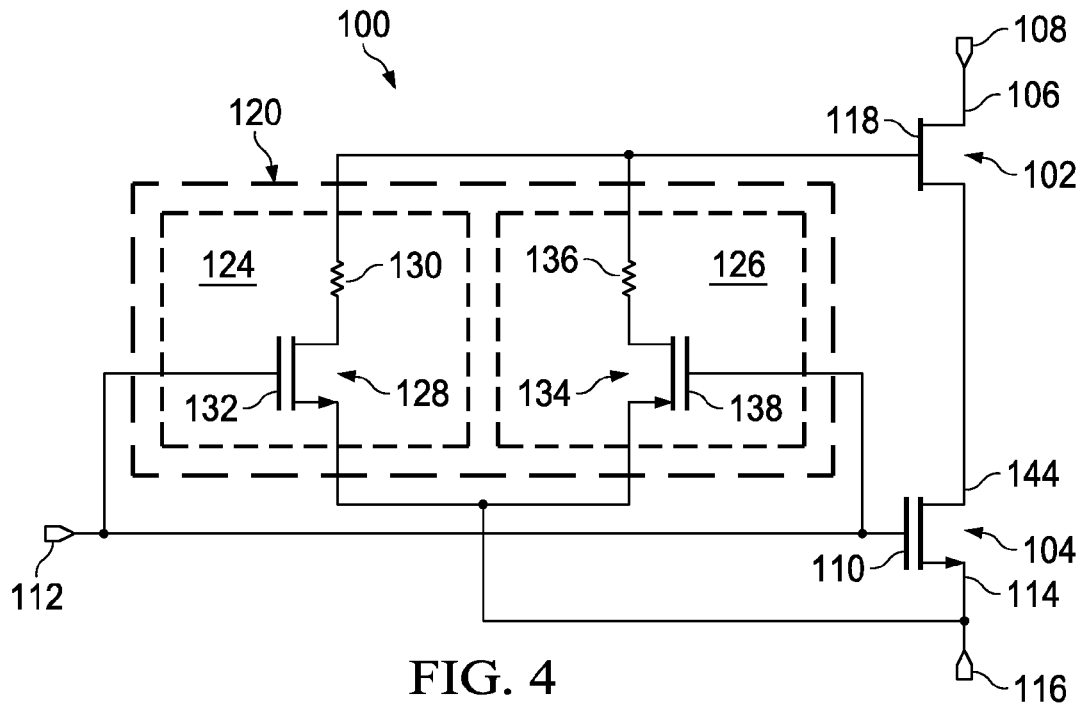
FIG. 4 is a schematic of a specific semiconductor device per the example of FIG. 3.

FIG. 4 is a schematic of a specific semiconductor device per the example of FIG. 3. The gate network 120 includes a gate turn-on network 124 and a gate turn-off network 126. The gate turn-on network 124 includes a turn-on NMOS transistor 128 in series with a turn-on resistor 130. A gate 132 of the turn-on NMOS transistor 128 is coupled to the gate terminal 112 of the semiconductor device 100. An impedance of the turn-on resistor 130 and an on-state resistance of the turn-on NMOS transistor 128, combined with a gate capacitance of the gate 118 of the GaN FET 102, form a resistor-capacitor network with a time constant that controls a turn-on time of the GaN FET 102. During operation of the semiconductor device 100, when a gate signal applied to the gate terminal 112 rises from an off-state to an on-state, the turn-on NMOS transistor 128 is turned on and the GaN FET 102 is subsequently turned on after a delay provided by the time constant of the turn-on resistor 130 and the turn-on NMOS transistor 128, combined with the gate 118 of the GaN FET 102. For example, the turn-on time may be controlled to 1 to 10 nanoseconds after the on-state gate signal is applied to the gate terminal 112.

The gate turn-off network 126 includes a turn-off p-channel metal oxide semiconductor (PMOS) transistor 134 in series with a turn-off resistor 136. A gate 138 of the turn-of PMOS transistor 134 is coupled to the gate terminal 112. An impedance of the turn-off resistor 136 and an on-state resistance of the turn-off NMOS transistor 134, combined with the gate capacitance of the gate 118 of the GaN FET 102, form a resistor-capacitor network with a time constant that controls a turn-off time of the GaN FET 102. During operation of the semiconductor device 100, when a gate signal applied to the gate terminal 112 drops from the on-state to the off-state, the turn-off PMOS transistor 134 is turned on and the turn-off time of the GaN FET 102 is subsequently turned off after a delay provided by the time constant of the turn-off resistor 136 and the turn-off NMOS transistor 134, combined with the gate 118 of the GaN FET 102. For example, the turn-off time may be controlled to 1 to 10 nanoseconds after the off-state gate signal is applied to the gate terminal 112.

Figure 5:
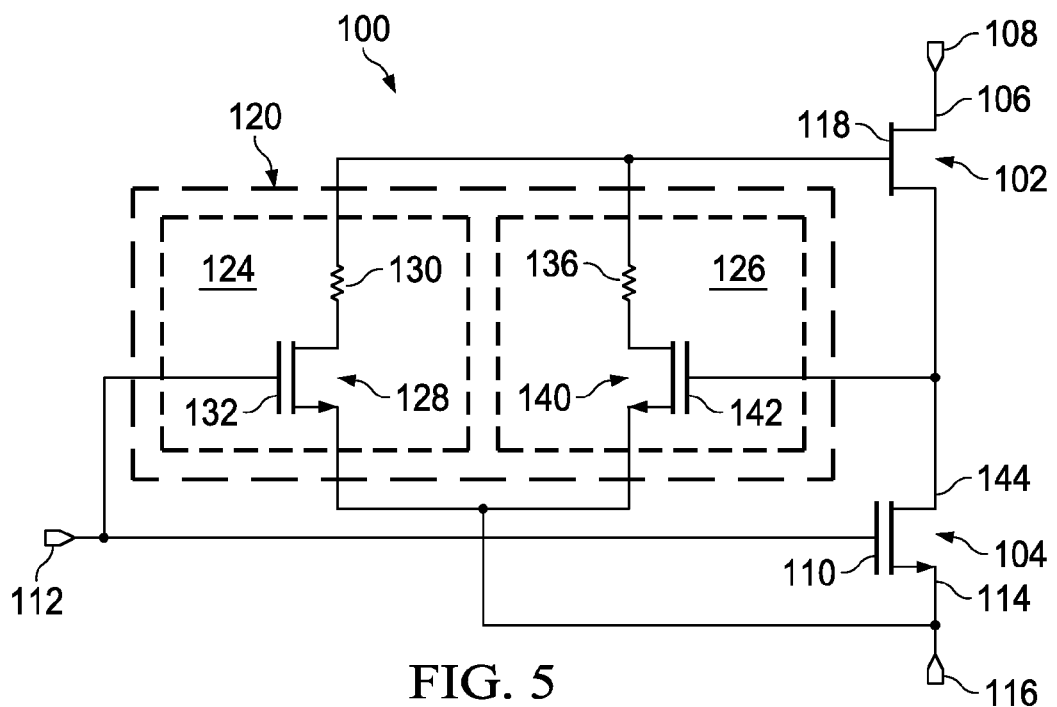
FIG. 5 is a schematic of another specific semiconductor device per the example of FIG. 3.

FIG. 5 is a schematic of another specific semiconductor device per the example of FIG. 3. The gate network 120 includes a gate turn-on network 124 and a gate turn-off network 126. The gate turn-on network 124 includes a turn-on NMOS transistor 128 in series with a turn-on resistor 130, in which a gate 132 of the turn-on NMOS transistor 128 is coupled to the gate terminal 112 of the semiconductor device 100. An impedance of the turn-on resistor 130 and an on-state resistance of the turn-on NMOS transistor 128, combined with a gate capacitance of the gate 118 of the GaN FET 102, form a resistor-capacitor network with a time constant that controls a turn-on time of the GaN FET 102.

The gate turn-off network 126 includes a turn-off NMOS transistor 140 in series with a turn-off resistor 136. A gate 142 of the turn-off NMOS transistor 140 is coupled to a drain 144 of the cascoded NMOS transistor 104. An impedance of the turn-off resistor 136 and an on-state resistance of the turn-off NMOS transistor 134, combined with the gate capacitance of the gate 118 of the GaN FET 102, form a resistor-capacitor network with a time constant that controls a turn-off time of the GaN FET 102.

During operation of the semiconductor device 100, when a gate signal applied to the gate terminal 112 drops from the on-state to the off-state, a potential at the drain 144 rises and turns on the turn-off NMOS transistor 134. The turn-off time of the GaN FET 102 is then controlled by the turn-off resistor 136, an on-state resistance of the turn-off NMOS transistor 140, and the gate capacitance of the gate 118 of the GaN FET 102. For example, the turn-off time may be controlled to 1 to 10 nanoseconds after the off-state gate signal is applied to the gate terminal 112.

Figure 6:
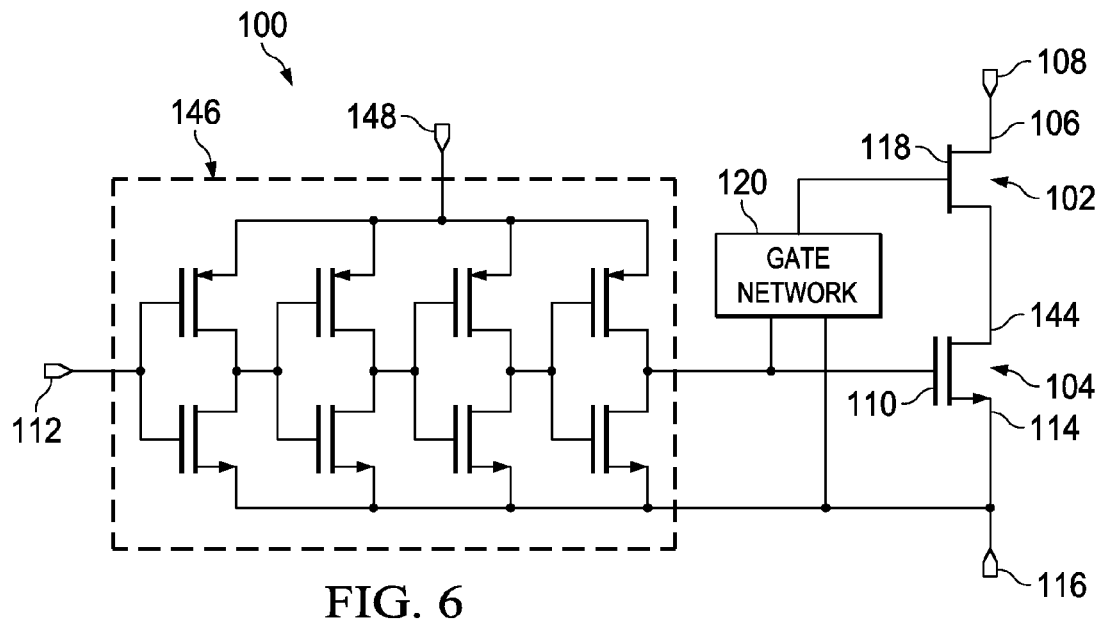
FIG. 6 depicts an exemplary four-terminal semiconductor device.

FIG. 6 depicts an exemplary four-terminal semiconductor device. The semiconductor device 100 includes a depletion mode GaN FET 102 cascoded with an NMOS transistor 104 and a gate network 120 coupling a gate 118 of the GaN FET 102 with a source 114 of the NMOS transistor 104, as described in reference to FIG. 1. A gate 110 of the NMOS transistor 104 is coupled to a gate terminal 112 of the semiconductor device 100 through an interface circuit 146. The interface circuit 146 may include, for example, one or more complementary metal oxide semiconductor (CMOS) buffers as depicted in FIG. 6, and/or possibly an edge sensor and/or a level shifter. A voltage supply terminal 148 for the interface circuit 146 is a fourth terminal of the semiconductor device 100.

Figure 7:
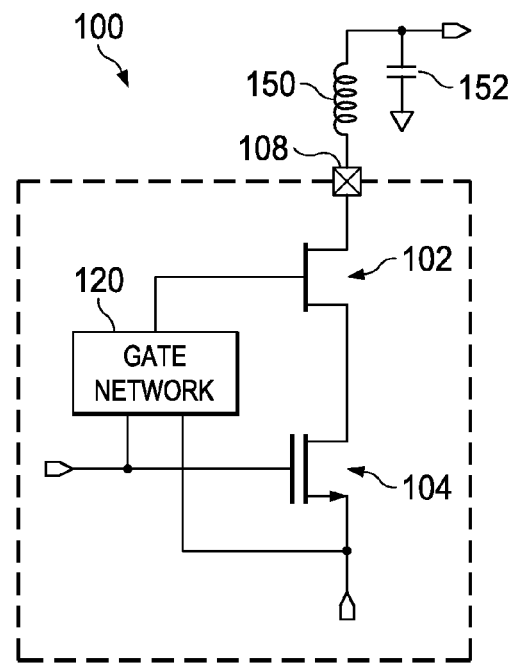
FIG. 7 and FIG. 8 are schematics of semiconductor devices in exemplary applications.
Figure 8:
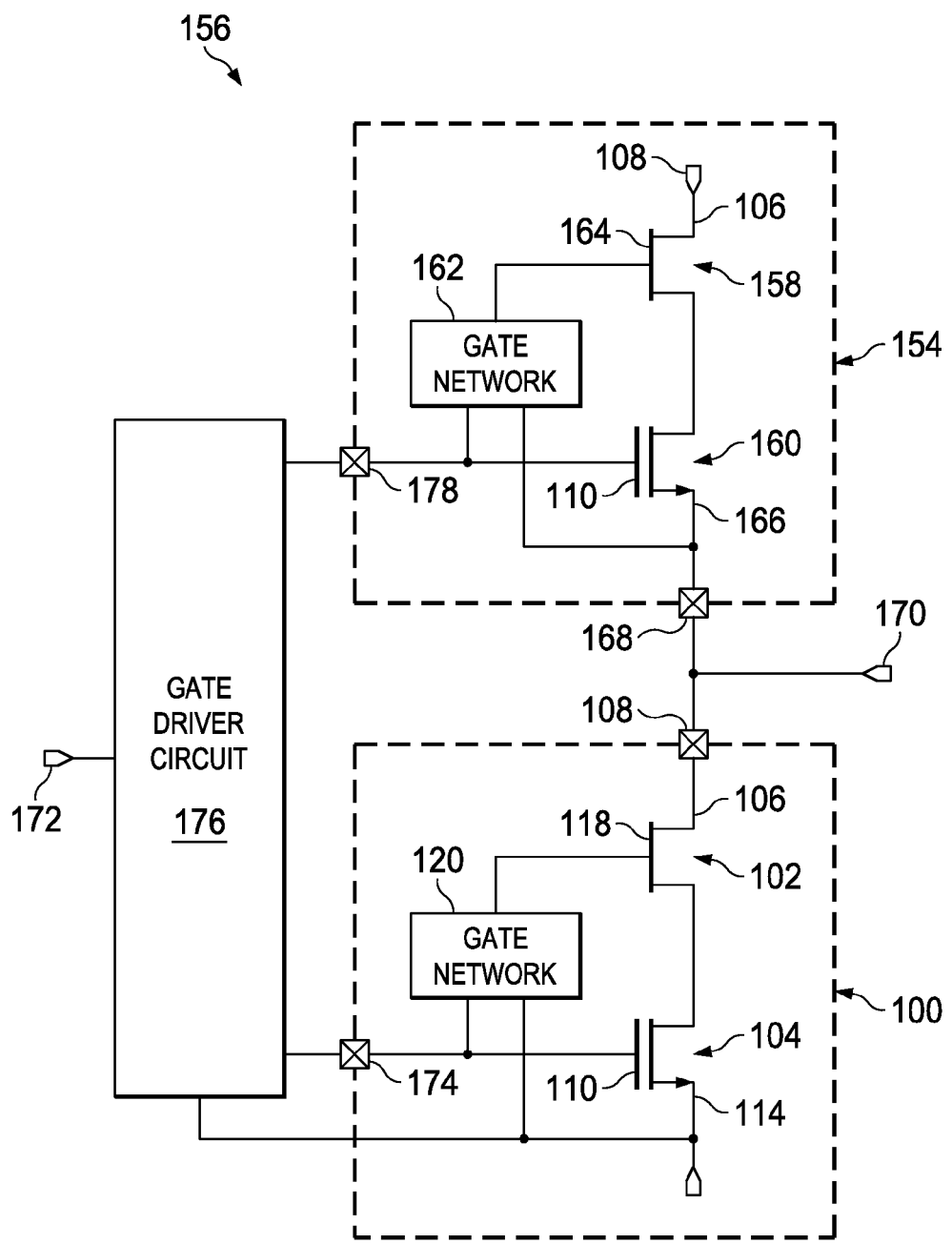

FIG. 7 and FIG. 8 are schematics of semiconductor devices in exemplary applications. Referring to FIG. 7, a semiconductor device 100 is connected through a drain terminal 108 to an inductor 150 and a capacitor 152 is connected in series with the inductor 150, in a single-ended flyback configuration. In a flyback configuration, a gate network 120 may be configured to control a turn-off time of a GaN FET 102 to be longer than a turn-on time, to advantageously reduce a voltage transient at the drain terminal 108 and thus desirably increase reliability of the GaN FET 102.

Referring to FIG. 8, a lower semiconductor device 100 and an upper semiconductor device 154 are connected in a half-bridge voltage regulator 156. The lower semiconductor device 100 includes a lower GaN FET 102 cascoded with a lower NMOS transistor 104, and a lower gate network 120 coupling a gate 118 of the lower GaN FET 102 to a source 114 of the lower NMOS transistor 104. Similarly, the upper semiconductor device 154 includes an upper GaN FET 158 cascoded with an upper NMOS transistor 160, and an upper gate network 162 coupling a gate 164 of the upper GaN FET 158 to a source 166 of the upper NMOS transistor 160.

A drain terminal 108 of the lower semiconductor device 100 and a source terminal 168 of the upper semiconductor device 154 are connected to an output terminal 170 of the half-bridge voltage regulator 156. An input signal terminal 172 of the half-bridge voltage regulator 156 may be coupled through a gate driver circuit 176 to a gate terminal 174 of the lower semiconductor device 100 and to a gate terminal 178 of the upper semiconductor device 154.

During operation of the half-bridge voltage regulator 156, it may be desirable to avoid a condition in which the upper GaN FET 158, the upper NMOS transistor 160, the lower GaN FET 102 and the lower NMOS transistor 104 are in their respective on-states at the same time. Thus, the upper gate network 162 and the lower gate network 120 may be advantageously configured to control turn-on times of the upper GaN FET 158 and the lower GaN FET 102, respectively, to be longer than turn-off times of the upper GaN FET 158 and the lower GaN FET 102.

While various embodiments of the present invention have been described above, it should be understood that they have been presented by way of example only and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

What is claimed is:

1. A semiconductor device, comprising:
   a depletion mode gallium nitride field effect transistor (GaN FET) in which a drain of said depletion mode GaN FET is coupled to a drain terminal of said semiconductor device;
   an n-channel metal oxide semiconductor (NMOS) transistor configured to operate in an enhancement mode, in which a drain of said NMOS transistor is coupled to a source of said depletion mode GaN FET; and
   a gate network which independently controls a turn-on time and a turn-off time of said depletion mode GaN FET in conjunction with a gate to drain capacitance of the GaN FET, said gate network being coupled to a gate of said depletion mode GaN FET, a source of said NMOS transistor and a gate of said NMOS transistor.

2. The semiconductor device of claim 1, in which said gate network controls said turn-on time to 1 to 10 nanoseconds and controls said turn-off time to 1 to 10 nanoseconds.

3. The semiconductor device of claim 1, in which:
said gate of said NMOS transistor is coupled to a gate terminal of said semiconductor device;
said source of said NMOS transistor is coupled to a source terminal of said semiconductor device; and
said drain terminal, said gate terminal and said source terminal are the only terminals of said semiconductor device.

4. The semiconductor device of claim 1, further comprising an interface circuit coupling said gate of said NMOS transistor to a gate terminal of said semiconductor device, said interface circuit being configured to obtain power from a voltage supply terminal of said semiconductor device.

5. A semiconductor device, comprising:
a depletion mode GaN FET in which a drain of said depletion mode GaN FET is coupled to a drain terminal of said semiconductor device;
an NMOS transistor configured to operate in an enhancement mode, in which a drain of said NMOS transistor is coupled to a source of said depletion mode GaN FET; and
a gate network which independently controls at least one of a turn-on time and a turn-off time of said depletion mode GaN FET in conjunction with a gate to drain capacitance of the GaN FET, said gate network including a resistor, a first end of said resistor being coupled to a gate of said depletion mode GaN FET and a second end of said resistor being coupled to a source of said NMOS transistor.

6. The semiconductor device of claim 5, in which said gate network controls said turn-on time to 1 to 10 nanoseconds and controls said turn-off time to 1 to 10 nanoseconds.

7. The semiconductor device of claim 5, in which:
said gate of said NMOS transistor is coupled to a gate terminal of said semiconductor device;
said source of said NMOS transistor is coupled to a source terminal of said semiconductor device; and
said drain terminal, said gate terminal and said source terminal are the only terminals of said semiconductor device.

8. The semiconductor device of claim 5, further comprising an interface circuit coupling said gate of said NMOS transistor to a gate terminal of said semiconductor device, said interface circuit being configured to obtain power from a voltage supply terminal of said semiconductor device.

9. A semiconductor device, comprising:
a depletion mode GaN FET in which a drain of said depletion mode GaN FET is coupled to a drain terminal of said semiconductor device;
an NMOS transistor configured to operate in an enhancement mode, in which a drain of said NMOS transistor is coupled to a source of said depletion mode GaN FET; and
a gate network coupled to a gate of said depletion mode GaN FET, a source of said NMOS transistor and a gate of said NMOS transistor, said gate network including a gate turn-on network which independently controls a turn-on time of said depletion mode GaN FET, and including a gate turn-off network which independently controls a turn-off time of said depletion mode GaN FET, and wherein said gate turn—on network includes a turn—on resistor in series with a turn—on transistor coupled between the said gate of said depletion mode GaN FET and said source of said NMOS transistor a gate of said turn—on transistor being coupled to the gate of said NMOS transistor; and
said turn—off network includes a turn—off resistor in series with a turn—off transistor coupled between said gate of said depletion mode GaN FET and said source of said NMOS transistor a gate of said turn—off transistor being coupled to a gate of the NMOS transistor, wherein the turn—on and turn—off resistors work in conjunction with gate to drain capacitance of the GaN FET to control turn on and turn off times for the GaN FET.

10. The semiconductor device of claim 9, in which said turn-on time is greater than said turn-off time.

11. The semiconductor device of claim 9, in which said turn-off time is greater than said turn-on time.

12. The semiconductor device of claim 9, in which said turn-off time is 1 to 10 nanoseconds and said turn-on time is 1 to 10 nanoseconds.

13. The semiconductor device of claim 9, in which:
said gate of said NMOS transistor is coupled to a gate terminal of said semiconductor device;
said source of said NMOS transistor is coupled to a source terminal of said semiconductor device; and
said drain terminal, said gate terminal and said source terminal are the only terminals of said semiconductor device.

14. The semiconductor device of claim 9, further comprising an interface circuit coupling said gate of said NMOS transistor to a gate terminal of said semiconductor device, said interface circuit being configured to obtain power from a voltage supply terminal of said semiconductor device.

15. The semiconductor device of claim 9, in which said drain terminal of said semiconductor device is connected to an inductor and a capacitor is connected in series with said inductor.

16. The semiconductor device of claim 9, in which:
said depletion mode GaN FET is a first depletion mode GaN FET;
said NMOS transistor is a first NMOS transistor; and
said semiconductor device is connected to a second semiconductor device, said second semiconductor device comprising:
a second depletion mode GaN FET in which a drain of said second depletion mode GaN FET is coupled to a drain terminal of said second semiconductor device;
a second NMOS transistor configured to operate in an enhancement mode, in which a drain of said second NMOS transistor is coupled to a source of said second depletion mode GaN FET; and
a second gate network coupled to a gate of said second depletion mode GaN FET, a source of said second NMOS transistor and a gate of said second NMOS transistor, said second gate network including a second gate turn-on network which controls a turn-on time of said second depletion mode GaN FET, and including a second gate turn-off network which controls a turn-off time of said second depletion mode GaN FET;
in which said source of said second NMOS transistor is coupled to said drain of said first depletion mode GaN FET.

17. The semiconductor device of claim 9 wherein the transistor of the gate turn—off network has a gate coupled to the source of the depletion mode GaN FET.

18. The semiconductor device of claim 9 wherein the transistor of the gate turn—off network as a gate coupled to the source of the depletion mode GaN FET.

\* \* \* \* \*